US012699827B1

(12) United States Patent
Poplack et al.

(10) Patent No.: US 12,699,827 B1
(45) Date of Patent: Aug. 4, 2026

(54) MODELING OF FOUR-STATE-AWARE CONTENT-ADDRESSABLE MEMORIES IN AN EMULATION SYSTEM

(71) Applicant: Cadence Design Systems, Inc., San Jose, CA (US)

(72) Inventors: Mitchell G. Poplack, San Jose, CA (US); Viktor Salitrennik, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 681 days.

(21) Appl. No.: 18/315,385

(22) Filed: May 10, 2023

(51) Int. Cl.
*G06F 30/3308* (2020.01)
*G06F 30/327* (2020.01)

(52) U.S. Cl.
CPC ........ *G06F 30/3308* (2020.01); *G06F 30/327* (2020.01)

(58) Field of Classification Search
USPC ........................................................ 716/103
See application file for complete search history.

(56) References Cited

U.S. PATENT DOCUMENTS 10,410,713 B1 * 9/2019 Selvidge ............. G11C 7/1006

* cited by examiner

*Primary Examiner* — Bryce M Aisaka
(74) *Attorney, Agent, or Firm* — Foley & Lardner LLP

(57) ABSTRACT

The systems and methods described herein include an emulation system for modeling user integrated circuit (IC) designs having content-addressable memory (CAM) or ternary content-addressable memory (TCAM) design elements. The emulator includes compiling software performing synthesis and compiling operations that compile netlist logic for IC designs, including virtual instrumentation logic for handling administrative overhead functions. For a CAM/TCAM instance of the IC design, the emulator instantiates a wrapper comprising instrumentation logic that performs translation or transformation functions on inputs into the CAM/TCAM and on outputs produced from the CAM/TCAM, facilitating compatibility. The wrapper logic includes logic for modeling a CAM/TCAM search of the memory locations, including table-matching logic for comparing search query bits against the memory locations. The wrapper may further include error-handling logic for generating error messages in circumstances when the emulator or the IC design cannot handle the output of the CAM/TCAM.

20 Claims, 10 Drawing Sheets

100

TCAM Bit-Matching Table 400a

| A | z (don't care) | 0 | 1 | 0 | 1 |
| B | z (don't care) | 0 | 1 | 1 | 0 |
| MASK | 0 | 1 | 1 | 1 | 1 |
| MATCH ON | Always | Always | Never | PATTERN = 1 | PATTERN = 0 |

FIG. 4A

TCAM Bit-Matching Table 400b

| Address | Content (value) | Content (should match?) | Interpretation |
|---|---|---|---|
| 0 | C0_A8_0C_01_00 | FF_FF_FF_FF_00 | 192.168.12.1 – Port 0 |
| 1 | C0_A8_00_00_01 | FF_FF_00_00_00 | 192.168.*.* – Port 1 |
| 2 | 0A_08_08_01_02 | FF_FF_FF_FF_00 | 10.8.8.1 – Port 2 |
| 3 | AC_00_00_00_04 | FF_00_00_00_00 | 172.*.*.* – Port 4 |
| ⋮ | | | |

FIG. 4B

TCAM Content Encoding Table 400c

| X[n] | Y[n] | Interpretation | Shorthand |
|------|------|----------------|-----------|
| 0 | 0 | Matches everything | ? |
| 0 | 1 | Matches '1' | 1 |
| 1 | 0 | Matches '0' | 0 |
| 1 | 1 | Never matches (unless pattern matches everything) | - |

*FIG. 4C*

TCAM Search Pattern Encoding Table 400d

| mask[n] | pat[n] | Interpretation | Shorthand |
|---------|--------|----------------|-----------|
| 0 | 0 | Matches everything | ? |
| 0 | 1 | Matches everything | ? |
| 1 | 0 | Matches '0' | 0 |
| 1 | 1 | Matches '1' | 1 |

*FIG. 4D*

TCAM Matching Function 400e

| m[n] | Content | | | |
|---|---|---|---|---|
| | 0 | 1 | ? | - |
| Effective Pattern 0 | 1 | 0 | 1 | 0 |
| 1 | 0 | 1 | 1 | 0 |
| ? | 1 | 1 | 1 | 1 |

FIG. 4E

4-State TCAM Matching Function 400f

| m[n] | Content | | | |
|---|---|---|---|---|
| | 0 | 1 | ? | - |
| Effective Pattern 0 | 1 | 0 | 1 | 0 |
| 1 | 0 | 1 | 1 | 0 |
| ? | 1 | 1 | 1 | 1 |
| X | 0 | 0 | 1 | 0 |

FIG. 4F

Final Four-State TCAM Search Pattern Function 400g

| m[n] | | Content bit(s) | | | | |
|---|---|---|---|---|---|---|
| | | 0 | 1 | ? | '_' or 'X' |
| Pattern bit(s) | 0 | 1 | 0 | 0 | 0 | 0 |
| | 1 | 0 | 1 | 0 | 0 |
| | ? | 1 | 1 | 1 | 1 |
| | X | 0 | 0 | 1 | 0 |

*FIG. 4G*

TCAM Function Table 400h

| {~PAT[n], ~MASK[n]} | | | | | {~Y[n], ~X[n]} |
|---|---|---|---|---|---|
| | 11 | 10 | 01 | 00 | 11 |
| S[0] = 0 | F | E | D | C | 10 |
| | B | A | 9 | 8 | 01 |
| S[0] = 1 | 7 | 6 | 5 | 4 | 00 |
| | 3 | 2 | 1 | 0 | |
| | | | FTAB[S[2:1]][15:0] | | |

*FIG. 4H*

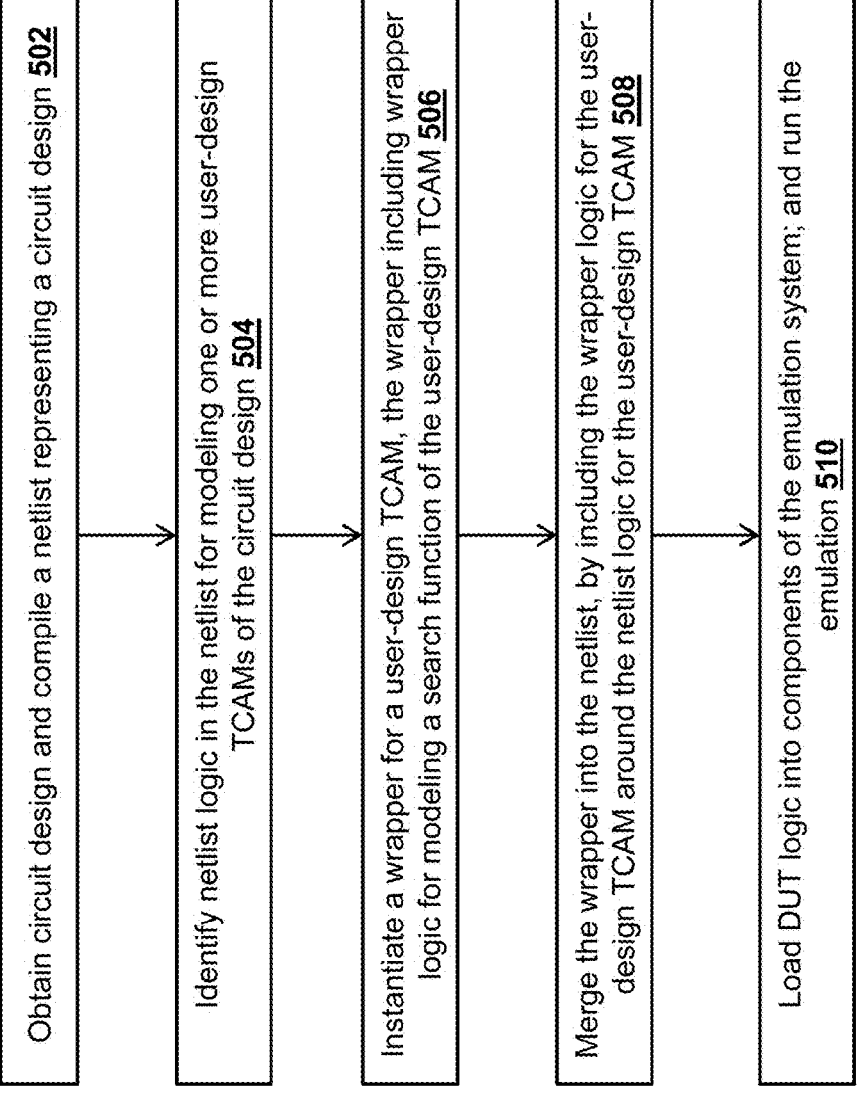

Obtain circuit design and compile a netlist representing a circuit design 502

Identify netlist logic in the netlist for modeling one or more user-design TCAMs of the circuit design 504

Instantiate a wrapper for a user-design TCAM, the wrapper including wrapper logic for modeling a search function of the user-design TCAM 506

Merge the wrapper into the netlist, by including the wrapper logic for the user-design TCAM around the netlist logic for the user-design TCAM 508

Load DUT logic into components of the emulation system; and run the emulation 510

MODELING OF FOUR-STATE-AWARE CONTENT-ADDRESSABLE MEMORIES IN AN EMULATION SYSTEM

TECHNICAL FIELD

This application is generally directed towards emulation systems and more specifically towards content-addressable memories in emulation systems that support representation of three-state signals in emulators supporting four potential logic states.

BACKGROUND

Modern semiconductor based integrated circuits (ICs) are incredibly complex and contain millions of circuit devices, such as transistors, and millions of interconnections between the circuit devices. Designing such complex circuits cannot be accomplished manually, and circuit designers use computer based Electronic Design Automation (EDA) tools for synthesis, debugging, and functional verification of the ICs. A significant function of EDA tools is emulation of a user logical system (e.g., an IC design) to perform pre-silicon functional verification, firmware and software development, and post-silicon debug. To achieve this, a typical processor-based emulation system comprises several Application Specific Integrated Circuits (ASICs) all working together to execute a program generated by an emulation compiler generated from the user's IC design. The compiled program models a design under test (DUT) that is a logical representation of the user's IC design running on the emulation system.

Emulation systems may comprise hardware components, such as emulation chips, emulation processors, memories, multiplexers (MUXs), or other types of logic circuit devices capable of performing processor-based (e.g., hardware-based) emulation of logic systems, such as integrated circuits (ICs), application specific integrated circuits (ASICs), central processing units (CPUs), graphics processing units (GPU), field-programmable gate arrays (FPGAs), and the like. By programming the components of the emulator to execute various forms of programmable logic according to a netlist for the IC design, the emulation processors and other components may emulate, model, or otherwise mimic the structure and functionality of nearly any prototype logic system-design of a DUT that is undergoing testing. In this way, processor-based emulation allows designers to prototype a logic system's design using reprogrammable computing hardware, before a manufacturer expends resources manufacturing a logic system product based on the design.

An emulator may generate, compile, execute, or otherwise represent a user's IC design in various, machine-readable, logical formats. For example, the user's logic design may be written in or converted to a hardware design language (HDL), such as Verilog, which a compiler (or other software) of the EDA tools then synthesizes or otherwise converts into a netlist. Sometimes, the netlist also describes the IC design logic in Verilog, though the netlist need not include the same machine-readable format or language. The netlist includes logic for programming, executing, or otherwise instrumenting aspects of the user design. When loaded into the components of the emulator, the logic of the netlist configures the various emulator components (e.g., emulator processors, emulator multiplexers, emulator physical memories, emulator logic devices) to model user components or functions of the user's IC design.

In some circumstances, the user's IC design contains content-addressable memories (CAMs) or ternary content-addressable memories (TCAMs). These types of memory components include abilities to read and write, like a standard memory, but also include an ability to search the contents. Oftentimes, CAMs/TCAMs are used in a number of technical fields or products, especially in networking appliances (e.g., routers, switches, firewalls). For example, CAM and TCAM memories are frequently used to store routing tables or MAC address lookup tables, because these types of memories are so quickly queried to determine how IP packets should be routed. A designer of underlying IC circuitry for these types of devices benefit from an emulation system that emulates an IC design having CAM/TCAM design components by modeling the structures and functions of the CAM/TCAM design components within the emulator's components.

A problem with emulating CAMs/TCAMs is that emulators typically do not include actual CAM/TCAM memory hardware. Many or perhaps most IC designs do not include CAM/TCAM design components, and CAM/TCAM hardware is not general purpose enough to be flexible and deployable for most IC design emulation purposes. Consequently, emulation vendors typically omit CAM/TCAM hardware in the emulator products. Rather, emulators include hardware and/or software components capable of mimicking CAM/TCAM functionality when modeling CAM/TCAM design elements of the users' IC designs.

In conventional emulation systems, CAM/TCAM emulation functions are ordinarily accomplished using the standard resources-typically the emulation processors, processor clusters, or specialized gates. This involves creating the emulated output logic through emulation processors, which the emulator programs to act as improvised registers and to provide the comparison logic that is integral to CAM/TCAM functionality, such as imitating a memory query functionality. These conventional emulation systems, however, require a relatively large number of processors in order to emulate even the smallest CAM/TCAM. As such, although it is possible for conventional emulation systems to emulate the functionality of CAM/TCAM logic circuits through clever imitation, it is also very expensive in terms of emulation resource capacity, demand, and availability.

In other conventional emulation systems, rather than using specialized gates or the existing processors of the emulation system to emulate CAM/TCAM memory, certain programmable logic configures existing memory circuits of the emulation system to imitate the search engine functionality for querying the existing memory circuits programmed to function as the CAM/TCAM memory of the user's design. A hardware-based search engine and addresses of the repurposed, user-allocated emulator memory (e.g., RAM, SRAM, DRAM) allow such conventional emulation systems to model the functionality of CAM/TCAM memory. These conventional systems implement a comparator logic circuit and test block state machine circuit that query the user's CAM/TCAM memory. These are circuits or memories capable of simultaneously checking or querying each address of the user memory to determine whether the memory content in the memory matches a particular query-pattern (sometimes referred to as a "mask") representative of the memory content based upon comparing the memory content against the mask.

A complication with these approaches to modeling CAM/TCAM design components arises when modeling circuit designs that operate on four-state circuit designs that demand the emulator handle unknown ("X") and undriven ("Z") logic states. Conventional emulation systems are limited to supporting two-state known logic, handling only ones (1) and zeros (0). More specifically, the logic signals computed, detected, and stored by many conventional emulators could represent only two states: either "0" or "1." Some recent developments in conventional emulation systems introduced processors and logic devices capable of handling four-state logic, including "0," "1," unknown ("X"), and undriven ("Z"). In these improved conventional emulation systems, an IC design is compiled into an IC representation file (e.g., netlist) for execution by components of the emulator, where the compiled IC representation file includes three possible logical values (0, 1, X), as the undriven signal is moot in emulation.

However, these recent conventional emulation systems still have limitations in handling memory components of the user's design and limitations in emulating the DUT, where the emulators and the DUT may be limited to only binary memories.

SUMMARY

What is needed is an improvement means for emulating CAMs/TCAMs of a user's IC design in an emulator system implementing four-state signals, without including additional or specialized hardware into the emulator. Disclosed herein are systems and methods that address the above-discussed shortcomings in the art, and may also provide any number of additional or alternative benefits as well.

Embodiments described herein recreate the functionality a CAM/TCAM memory circuit that can be integrated into a processor-based emulation system. An emulation system includes hardware and software components for modeling user IC designs having content-addressable memories (CAMs), and/or ternary content-addressable memories (TCAMs) in emulation hardware modeling four-state logic states. The emulator may compile and execute logic to properly handle unknown values (X's) in the content of the memory locations of the CAMs/TCAMs, and may also model the expected behavior of the user-design memory when there are X's on control or address inputs of the user-design memory. Moreover, the proper modeling must include techniques to corrupt the entire memory instantaneously due to certain combinations of inputs or due to UPF events.

Embodiments may instantiate instrumentation logic defining a four-state CAM wrapper, containing instrumentation logic defining a native TCAM macro with flexible X[n] bits, as an alternative to the instrumentation logic defining the typical CAM macro. A compiler of the emulation system instantiates the wrapper logic for the TCAM instance. The wrapper logic performs translation or transformation operations on input signal bits, fed into the TCAM instance, and performs translation or transformation operations on the output signal bits produced by the TCAM instance.

In an embodiment, a system for emulating circuit designs including ternary content-addressable memories (TCAMs). The system comprises a set of emulator hardware for emulating a circuit design that operates with an unknown logic state, including a plurality of emulation processors for modeling a plurality of user-design circuits according to a netlist of the circuit design, and a plurality of physical binary memories for modeling one or more user-design TCAMs according to the netlist; and a computing processor configured to: identify, in a netlist for the circuit design, netlist logic for modeling a user-design TCAM using a physical binary memory of the emulator hardware; instantiate a wrapper for the user-design TCAM, the wrapper comprising wrapper logic for modeling a search function of the user-design TCAM; and merge the wrapper into the netlist by including the wrapper logic for the user-design TCAM around the netlist logic for the user-design TCAM of the netlist.

In another embodiment, a computer-implemented for emulating circuit designs including ternary content-addressable memories (TCAMs). The method comprises obtaining, by a computer, a netlist for a circuit design that operates with an unknown state and having one or more user-design ternary content-addressable memories (TCAMs) to be modeled according to the netlist using a plurality of physical binary memories of emulator hardware; identifying, by the computer, netlist logic of the netlist for modeling a user-design TCAM of the one or more user-design TCAMs; instantiating, by the computer, a wrapper for the user-design TCAM, the wrapper including wrapper logic for modeling a search function of the user-design TCAM; and merging, by the computer, the wrapper into the netlist, by including the wrapper logic for the user-design TCAM around the netlist logic for the user-design TCAM.

It is to be understood that both the foregoing general description and the following detailed description are exemplary and explanatory and are intended to provide further explanation of the invention as claimed.

BRIEF DESCRIPTION OF THE DRAWINGS

The present disclosure can be better understood by referring to the following figures. The components in the figures are not necessarily to scale, emphasis instead being placed upon illustrating the principles of the disclosure. In the figures, reference numerals designate corresponding parts throughout the different views.

FIGS. 4A-4H shows logic tables implemented by instrumentation logic for modeling TCAM search functionality of a user design TCAM, according to various embodiments.

FIG. 5 shows operations of a method for an emulation system, according to an embodiment.

DETAILED DESCRIPTION

Figure 1:
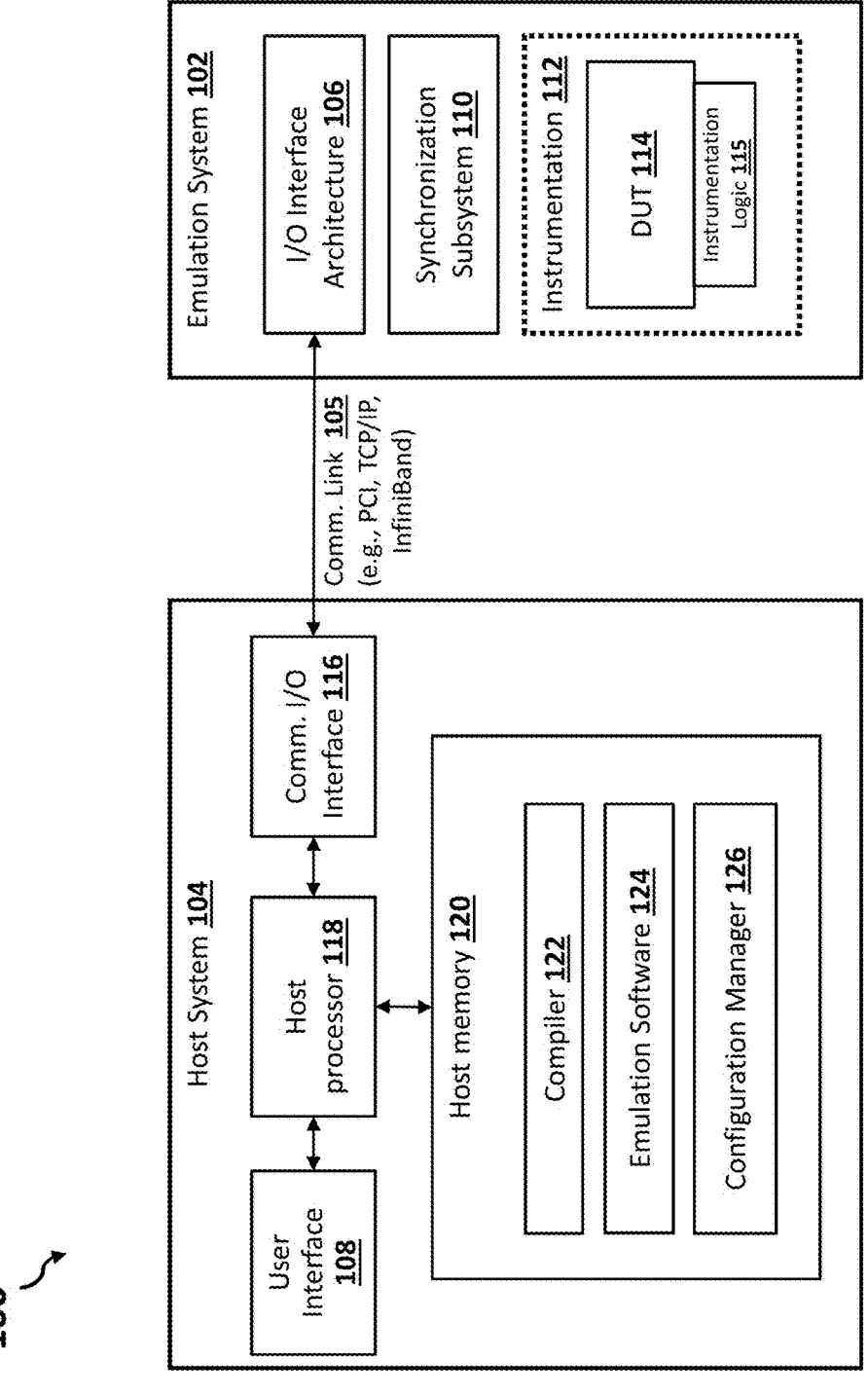
FIG. 1 shows components of a system for emulation that supports modeling structures and functions of CAMs/TCAMs of a user IC design, according to an embodiment.

Reference will now be made to the illustrative embodiments illustrated in the drawings, and specific language will be used here to describe the same. It will nevertheless be understood that no limitation of the scope of the invention is thereby intended. Alterations and further modifications of the inventive features illustrated here, and additional applications of the principles of the inventions as illustrated here, which would occur to a person skilled in the relevant art and having possession of this disclosure, are to be considered within the scope of the invention.

User IC designs may include CAM or TCAM design elements, which are specialized memory circuitry capable of simultaneously checking all addresses of the particular memory to determine whether the memory contains certain content at an address, or a particular address itself. The CAM/TCAM performs a query for the content or address by determining whether any memory location contains the content or has the address matching a query bit-pattern mask. For example, CAMs are often used in networking devices and can serve as a structure similar to a hash table or routing table. For example, a CAM may contain a list of ports to which a packet should be routed based on a given IP address. When the packet arrives, the networking device searches for the IP address in the table, and, if present, the CAM outputs a match signal for each line of the memory indicating that the content of that line matches the bit-pattern for the IP address that was searched. By extension, a TCAM facilitates a ternary or third bit, allowing the content data bits to additionally represent "always match" or "never match" conditions. When the user IC design includes CAM/TCAM design elements, an emulation system should be capable of modeling the CAM/TCAM structures and functions in order to provide the user with a proper validation of the user's IC design elements.

An emulation system can model search functions of CAM memories of a user design using emulation processors or other logic devices of the emulator. The emulator processors are time-multiplexed computation resources that execute one or more instructions (complied from a netlist of the IC design) per emulation cycle. In some cases, the emulator includes hardware logic circuits, such as a comparator circuit, around the hardware memories of the emulator, and may employ this hardware for performing the CAM functions (this repurposed hardware is sometimes referred to as "CAM hardware"). In such cases, the emulator includes the searching capability around the emulator's memories, which the emulator uses for modeling the user-design memories. The emulator controlling software (e.g., compiler, partitioner, scheduler) allocates and programs the CAM hardware (e.g., logic hardware of the emulator and/or memory hardware of the emulator allocated to model the CAM design element(s) of the user IC design) to automatically query of a sequence of addresses to model the CAM design element. At runtime, the CAM hardware performs the search query of any number of physical memories in parallel, by comparing a query mask (representing the queried bit-pattern) against each value in the addresses. The CAM hardware then returns a bit for each address that indicates whether the CAM hardware matched the mask against the value of the content.

In this way, the improved emulation systems could search many physical memories in parallel or sequentially, thereby imitating the functionality of CAM circuitry in the IC design and thus enabling the emulation system to model the structures and functions of the CAM design elements. The CAM query functions are a specialized operation that iterates through all of these addresses on all the memory instances, in parallel, and perform the correct logical comparison functions for each memory instance. Improved emulation systems could reprogram and repurpose the CAM hardware to perform CAM query functions operations that the prior emulator hardware and instrumentation logic could not. The improved emulation systems could look at, for example, 32 memories in parallel, without having to generate 32 Read accesses functions.

A problem with some emulation systems was that modeling a standard user-design CAM (of the user IC design) does not support more than one physical bit per signal for the CAM content. Consequently, the standard user-design CAM cannot support logical transformations of binary signals. Instead, emulator instrumentation logic (e.g., netlist logic of the initial netlist; instrumentation logic of wappers) must convert the user-design CAM into a user-design TCAM in order to support the TCAM functionality. However, a CAM is functionally the same as a TCAM whose X[n] bits are always 0. Thus, embodiments may instantiate instrumentation logic defining a four-state CAM wrapper, containing instrumentation logic defining a native TCAM macro with flexible X[n] bits, as an alternative to the instrumentation logic defining the typical CAM macro.

Embodiments described herein provide for an emulation system that employs an adapted approach for TCAMs, but without any new specialized emulator hardware for modeling four-state IC designs. The emulator memories model storage functions (e.g., read, write) of CAM/TCAM memories and search functions of the CAM/TCAM memories. When modeling the storage functions in four-state designs, in order to model unknown values (X) of the user content or control signals, the compiler generates a wrapper containing logic that is merged into the logic of the netlist around a particular user memory to be modeled. The wrapper logic enables a binary physical memory of the emulator to model a TCAM of the user design. Additionally or alternatively, a wrapper enables an emulator memory to model the search functions of a CAM or TCAM. The logic of the compiled DUT may manage and reference a matching-logic table for the TCAM search functions. The DUT logic also manages the storage functions, including the functions that read or write entries as needed. In addition, the DUT logic accesses another port of the user's TCAM (sometimes referred to as the "search port"). The TCAM receives a query or search request, which takes a bit-pattern and/or a mask as a parameter. The DUT logic access the search port, which causes the TCAM to return each row of the TCAM that matches the bit pattern of the query request.

Although embodiments herein are described in terms of TCAMs, embodiments are not necessarily limited to modeling TCAMs. Embodiments may apply to modeling CAMs and/or TCAMs in user designs. The only change for modeling CAMs is that the user content and search functions are binary that can only encode {0,1} and not {0,1,?,-}, so only half as much physical memory is needed for modeling the CAM in the user design. Notably, the content and/or the pattern may effectively be "ternary" (hence the name TCAM) in the nature of the memory query and memory-related functions. This should not be confused with other uses of the term "ternary" in the context of four-state logic emulators referring to {0, 1, X}, including known values (0, 1) and unknown values (X). In addition, examples described herein make use of simplified encoding to make the examples easier to read. The actual encoding used by TCAM in the embodiments described herein may be different or even more complex. In some cases, for TCAM content, the emulator includes, for example, two bits for each "signal bit position" known as X and Y that the TCAM or emulators interpret according to logic tables. The logic tables implemented for TCAM search functions include '?' and '-' as potential values. The '?' and '-' representations in the content and pattern of search, used for TCAM searching, are unrelated to the unknown value (X representation) in four-state logic modeling. In four-state logic, 'X' represents an unknown value for the purpose of verification modeling, whereas '?' and '-' are actual states of a real circuit, represented by two-bit values for the purpose of modeling TCAM search behavior.

The emulation systems described herein include compiler (or similar software programs) that instantiate a CAM/TCAM instance in the DUT logic, but also generates instrumentation logic called a "wrapper," that executes certain functions (e.g., transformations) on the inputs and outputs of the CAM/TCAM instance, such that the wrapper is logically "wrapped around" the CAM/TCAM instance. When the user instantiates a TCAM, synthesis and compiling functions of the emulation system generate and inject the wrapper into the DUT, where the wrapper itself contains the standard TCAM macro. In operation, the wrapper handles resolution of X's on the inputs of the TCAM to the desired behavior, performs TCAM search queries, and may generate runtime error signals.

Example System Components

FIG. 1 shows components of a system 100 for emulation that supports modeling structures and functions of CAMs/TCAMs of a user IC design. The system 100 comprises a host system 104 and an emulation system 102. The emulation system 102 includes various hardware (and sometimes software components) for emulating the user design as emulator instrumentation 112. Reprogrammable emulation devices of the emulation system 102, such as emulation processors and emulator memories (e.g., non-transitory machine-readable media), are programmed to process logic or data inputs, and generate logic or data outputs, according to logic or instructions generated by the host system 104 by compiling a netlist of the user DUT 114 representing the user design. The host system 104 executes various software components (sometimes called a "test bench") for managing operations of the emulation system 102, and communicates data (e.g., netlist logic, instruction sets) with the emulation system 102 via one or more communication links 105.

The host system 104 may include one or more workstations that may run debug and runtime software that may interact with the emulation system 102. The host system 104 may include workstations that may be any type of computing devices such as a desktop computers, laptop computers, tablet computers, and smartphones. The host system 104 may be any computing device comprising a host processor 118, a host memory 120, and one or more communication I/O interfaces 116. The host system 104 may further include any number of support circuits, such as cache memory, power supply, clock circuits, data registers, and the like. The host processor 118 of the host system 104 may include circuitry configured to execute the various processes and tasks described herein. Non-limiting examples of the host processor 118 of the host system 104 may include an x86 central processing unit (CPU), an ARM processor, a Reduced Instruction Set Computing (RISC) processor, an ASIC processor, or a Complex Instruction Set Computing (CISC) processor, among others.

The host memory 120 of the host system 104 may store various forms of software programs and files for execution by the host processor 118, such as an operating system (OS) and emulation software 124. The emulation software 124 includes as a compiler 122 and/or a configuration manager 126. The host memory 120 implementations may include, but are not limited to, a random access memory (RAM), a read only memory (ROM), a hard disk drive (HDD), a secure digital (SD) card, a magneto-resistive read/write memory, an optical read/write memory, a cache memory, or a magnetic read/write memory.

The communication I/O interface 116 couples the host memory 120 or the host processor 118 to the emulation system 102. The communication I/O interface 116 manages and/or interprets communications with the emulation system 102 over the communication link 105. The communication I/O interface 116 or other support circuit may also receive inputs from user interface devices (e.g., keyboard, mouse) for the operating system (OS) of the host system 102, informing the OS to, for example, generate a user interface 108 (e.g., interactive graphical user interface (GUI)), including human-readable output at a computer monitor and an interactive display that receives user inputs from various user interface devices of the host system 104.

The compiler 122 comprises software configured to convert a hardware-design netlist file (e.g., hardware described in a hardware description language (HDL), such as Verilog) into a sequence of processor-executable instructions that can be evaluated by a hardware emulator, executed by the emulation system 102. The compiler 122 may be executed on any number of devices, such as the host system 104 or emulation system 102 shown in FIG. 1, or another device. The compiler 122 may be a software module component of design or emulation software 124, which may be executed by the host system 104 or emulation system 102; or the compiler 122 may be a standalone software application configured to compile a design file, such as a netlist file.

In operation, the compiler 122 receives and compiles the netlist design file containing design elements into virtual logic of the compiled design, such as the logic gates, of the IC design currently being designed and tested (shown as DUT 114). The compiler 122 generates a virtual logic file (representing the IC's logic) based on the compiled netlist. The compiler 122 maps or otherwise associates the IC's logic and timing of operations into the hardware components of the emulation system 102, according to the design of the IC. The compiler 122 generates machine-readable instructions for the components of the emulation system 102 that cause the mapped components of the emulation system 102 to function as the DUT 114.

The compiler 122 may include a partitioner component and a scheduler component, though it should be appreciated that the compiler 122 may be segmented into any number of discrete component software modules. In an opening import phase, the compiler 122 receives a netlist and then begins compiling the netlist. Here, the compiler 122 parses the logic gates of the netlist into a database format. The partitioner determines which part of the netlist is going to be executed by which hardware resource of the emulation system 102. Then, the scheduler determines the order and the specific timing of the execution of the virtual logic representing the netlist. The scheduler also determines the signal routes across the elements of the virtual logic. The scheduler may also determine when in the execution lifecycle the virtual logic represented by the netlist should be executed.

The compiler 122 (or other aspects of the emulator's test bench software) may generate and inject additional instrumentation logic 115, such as administrative or overhead logic that manages or controls various aspects of the emulation system 102. In some cases, the compiler 122 (or other aspect of the test bench) generates additional instrumentation logic 115 that the compiler 122 may append to, or inject around, certain portions of the netlist design logic (of the initial netlist) for modeling the components of the user's circuit design. For instance, in addition to the compiled netlist logic, the compiler 122 (or other software component) further includes virtual logic or instrumentation logic 115 that includes logic or other machine-readable instructions for device functions, timing, synchronization, memory management, and data transfers, among other functions.

The instrumentation logic 115 includes one or more wrappers generated by the compiler 122 (or by another component of the host system 104 or emulation system 102). The compiler 122 identifies certain netlist logic (in the netlist of the DUT 114) for modeling a user-design TCAM. The compiler 122 generates wrapper logic containing additional instrumentation logic 115 that the compiler 122 merges into the netlist or a virtual logic file containing the logic for modeling some or all of the DUT 114.

The emulation software 124 tracks the status, and controls the performance, of components of the emulation system 102. The emulation software 124 may determine which components of the emulation system 102 are available or unavailable to receive parts of the virtual logic generated by the compiler 122. In some cases, the emulation software 124 continuously polls or self-tests the emulation system 102 for faulty hardware components. In some cases, the emulation software 124 may determine the status of components of the emulation system 102 when parsing and loading the virtual logic for the DUT 114 into the hardware components of the emulation system 102. The designer can use the emulation software 124 to issue queries or instructions to the emulation system 102, such as requesting design-related information at certain points during the execution or instructing the emulation system 102 to execute from a certain breakpoint or for a certain number of steps/cycles.

A configuration manager 126 component of the emulation software 124 tracks the status of compiled instructions and controls the execution of instructions by components of the emulation system 102. The configuration manager 126 may determine and schedule which components of the emulation system 102 are available or unavailable to receive parts of the virtual logic generated by the compiler 122. In some cases, the configuration manager 126 continuously polls or self-tests the emulation system 102 for faulty hardware components, and may track the availability of various components of the emulation system 102.

The various software modules 122, 124, 126 may be executed in whole or in part on the host system 104, such as an administrator or IC designer's workstation computer, and configured to communicate data associated with the respective software module 122, 124, 126 to and from the emulation system 102. For example, in some cases, the host system 104 may execute the compiler 122 module that allows a user to input a netlist design file, containing logic gate designs of the prototype ASIC, and then compiles the netlist file. The resulting virtual logic file generated by the host system 104 may then be transmitted or otherwise downloaded to the emulation system 102. In this example, the emulation system 102 may execute the configuration manager 126 that tracks the availability of resources within the emulation system 102 and may schedule components of the emulation system 102 to model portions of the DUT 114.

The emulation system 102 includes portions of emulation hardware scheduled to model portions of the DUT 114. The particular emulator hardware components perform (or instrument) the portions of the logic of the DUT 114, as assigned and scheduled by the emulator software (e.g., compiler 122, configuration manager 126, partitioner, scheduler). Prior to loading the DUT 114 into the emulator hardware, the compiler 122 may inject the wrapper logic of each TCAM memory wrapper around the preexisting netlist logic, scheduled to be modeled by a corresponding physical binary memory. In operation, the emulation system 102 schedules and distributes the netlist logic and the wrapper logic to the emulator hardware or software. To model a given user-design TCAM instance, a physical binary memory instruments portions of the netlist logic, in conjunction with the wrapper logic instrumented by additional emulator hardware (or software) components of the emulation system 102. The emulator instrumentation 112 (e.g., scheduled portions of the emulation hardware and/or software of the emulation system 102) models the user-design TCAM by instrumenting the preexisting netlist logic assigned to the particular physical binary memory using the wrapper logic.

The emulation system 102 may be a combination of hardware and software components for emulating the DUT 114. As described below, the emulation system 102 may include clusters of emulation processors (e.g., clusters of interconnected ASICs), non-transitory memory devices, buffers, data storage devices configured for emulating the DUT 114. The emulation processor clusters may be arranged onto one or more circuit boards. The boards may be arranged within multiple racks. Multiple racks may be arranged in a plurality of emulation of devices, which may be analogous to multi-rack servers.

The emulation instrumentation 112 comprises hardware components (and, sometimes, supporting software) for executing the virtual logic of the DUT 114, transferring design and/or control data between components, and managing the execution. The emulation instrumentation 112 may include an emulation engine configured to be a programmable device used in the verification of hardware design of DUT 114. The emulation instrumentation 112 may test and verify the operation of the DUT 114, an entire board of ICs, or an entire system, without having to actually, physically fabricate the user-design hardware. The emulation instrumentation 112 generally comprises any number of racks with any number of emulation boards, organized logically into any number of board clusters. Each emulation board comprises one or more emulation chips 130, such as an ASIC. The emulation chip 130 comprises several reprogrammable emulation processors, often organized logically into any number of processor clusters 132. The emulation processors mimic the logic gates (or other logic/devices) of the DUT 114. The emulation system 102 may include any number of programmable logic devices (PLDs), such as field-programmable gate arrays (FPGAs), to perform or manage aspects of the emulation. Such devices may be coupled to an expansion board or other printed circuit board for communication via a bus or link, such as a PCI (or PCIe) bus or serial bus.

The emulation system 102 may further comprise an I/O interface architecture 106, a synchronization subsystem 110, and emulation instrumentation 112, which are logical aspects of the emulation system 102 comprising various hardware and software components of the emulation system 102. It should be appreciated that such logical aspects are mentioned for ease of description and understanding and are not necessarily boundaries or strictly defined sets of components. The I/O interface architecture 106 comprises hardware components for managing communications among components of the system 100. This subsystem provides a number of functions including, for example, providing the PCI interface 136 (or other types of interfaces for the communication link 105), communicating runtime communication (e.g., emulation job download, configuration, runtime control), and exchanging various types of design data, among other potential functions. The interface architecture 106 comprises an Internal System Bus (ISB) which allows transfer of data internally between target devices, such as block register interfaces and internal and external memories, back and forth with the I/O Buffers (IOBs) and ultimately PCIe.

The synchronization subsystem 110 is a logical collection of hardware and/or software components responsible for maintaining synchronization and controlling execution timing of components of the emulation system 104. At runtime, the emulation system 102 uses the communication link 105 to download design data, configures the synchronization logic, and initializes or uploads any design memories to the test bench as instructed. Configuration and control of the synchronization system 110 is done over the communication link 105 (e.g., Infiniband) to a data processing unit (DPU) and/or to the respective FPGAs.

The communication link 105 comprises any number of computing hardware and software components establishing a bus or link between computing devices using any number of communication protocols. In operation, the communication link 105 conducts data and/or instruction transfer between the host system 104 and the emulation system 102. Non-limiting examples of the communication link 105 include Peripheral Component Interconnect (PCI), which may include PCI express (PCIe), TCP/IP, and InfiniBand, among other types of communication links 105.

To emulate user-design TCAMs, the compiler 122 compiles the netlist and generates a wrapper, such that the properties or functions of a user-design TCAM appears the same as in the case of a physical binary memory. The properties and functions of the user-design TCAM may include, for example, memory ports (sometimes referred to as "pins") and memory port functions, such as memory port reads, memory port writes, multi-port reads, multi-port writes, modifying or translating binary signals, or performing memory searches of the user-design TCAM, among others.

For a given instance of a user-design TCAM, the compiler 122 instantiates the instrumentation logic 115 (sometimes referred to as "wrapper logic") of the wrapper around the netlist logic for user memory components intended for physical binary memory, but the wrapper logic augments or replaces portions of the netlist logic (e.g., netlist logic for MPRs and MPWs). Together, the combination of the initial netlist logic and the wrapper logic allows the physical binary memory to model the user-design TCAM. The wrapper logic performs certain TCAM functions, such as performing transformations or translations of ternary (or quaternary) signals on behalf of the physical binary memory during a Read or Write function, performing a search of the TCAM, or performing certain specified functions when the wrapper logic detects an unknown logic state (X) at a particular port of the physical binary memory.

The combination of the initial netlist logic of a physical binary memory and the wrapper logic of the corresponding wrapper, together, models the particular user-design TCAM, components of the user-design TCAM (e.g., ports of the TCAM), and various memory-related functions (e.g., Memory Read Port (MPR) functions, Memory Write Port (MPW) functions, memory search). As an example, for a given user-design TCAM identified in the DUT 114 by the compiler 122, the combination of the (initial or modified) netlist logic of the particular physical binary memory (scheduled to model the user-design TCAM) and the wrapper logic of the wrapper (instantiated for the particular user-design TCAM and merged around the netlist logic of the physical memory) together model the user-design memory functions (e.g., Read, Write) The compiler 122 instantiates the wrapper as additional instrumentation logic 115 that the compiler 122 merges with the initial netlist logic representing the user-design TCAM functions, around the portion of the netlist logic scheduled for the physical binary memory intended to model the user-design TCAM. Moreover, due to the potential for memory control bits (X-bits) in the user design to represent an unknown logic state (X's), the wrapper may include wrapper logic representing the necessary behaviors for handling the X-bits.

The compiler 122 instantiates the wrapper according to various parameters as indicated by properties of the user-design TCAM or user selected options for modeling a user-design TCAM. For instance, the compiler 122 automatically determines, or the user manually inputs, certain parameters that define a certain memory width (e.g., W-bits wide) and memory depth (e.g., D-locations deep) of the physical memory hardware assigned to model the user-design TCAM. The compiler 122 (or other software program) may select the physical memory hardware from the memory hardware of the emulation system 102 and, in some cases, as indicated by the wrapper logic of the wrapper. Optionally, the compiler 122 instantiates additional instrumentation logic 115 for one or more tag bits associated with portions of the user-design TCAM that function as tags indicating whether the data at a particular user-memory location should be treated as an unknown logic state (X). The emulation system 102 may logically and/or physically model or represent the user memories, such as the user-design TCAMs, as arrays. The compiler 122 assigns the user memories, such as the user-deign TCAMs, as arrays in the physical memory of the emulator hardware and assigns the tag bits to portions of the array, according to the netlist and/or the wrapper logic instantiated by the compiler 122. The tag bit assigned to each row of the array indicates whether the content data at that particular row or address should be treated as unknown logic state (X). In this way, the tag bit indicates whether the content at the particular location of the user-design TCAM is currently unknown.

In some circumstances, when modeling four-state logic, the logical memory arrays of the user memory, such as the user-design TCAM, could contain any number of X-bits representing unknown logic states (e.g., unknown values stored as the user-memory content data). The compiler 122 generates the netlist or the wrapper to indicate various memory-related functions that the memory hardware performs in an emulation. The compiler 122, for example, instantiates wrappers to perform certain memory functions when one or more X-bits arrive or occur at ports or control pins of the user-design memory or at underlying physical binary memory hardware modeling the user-design TCAM.

The compiler 122 identifies any number of TCAM instances in the circuit design and instantiates corresponding instances of these user-design TCAMs in the netlist logic for the DUT 114, according to the various synthesis and compiling functions. If the compiler 122 instantiates the user-design TCAM according to the user design, then the synthesis operations of the compiler 122 instantiates a corresponding wrapper for the particular user-design TCAM instance. For each user-design TCAM, the synthesis operations of the compiler 122 instantiate a wrapper that includes the wrapper logic for modeling the functionality of the particular user-design TCAM instance. The compiler 122 (or other component of the emulation system 102) merges the wrapper logic into the compiled netlist logic around the initial netlist logic of the user-design TCAM instance. The compiler 122 may replace, augment, or append the wrapper logic with the netlist logic, around the netlist logic for the user-design TCAM of the initial user netlist.

The wrapper logic models certain functions or enables the user-design TCAM to model certain functions. Non-limiting examples of such functions include transforming binary input or output signals, to and from the user-design TCAM; identifying and handling unknown logic states (X) on the inputs (at input ports) or outputs (at output ports) of the user-design TCAM according to the designer's desired behavior; generating runtime error signals or warning messages; and/or performing a memory-search function.

In some implementations, the wrapper logic may detect, identify, or otherwise determine that an unknown logic state (X) occurs at a control port or pin of the user-design TCAM and/or the underlying physical binary memory of the emulation system 102. In response to an unknown logic state (X), the wrapper logic outputs (or causes the memory hardware or other hardware of the emulation system 102 to output) the error signal or bit, and/or the warning message for the user interface 108. In some cases, the wrapper logic may halt further action at the user-design TCAM or further emulation cycles by the emulator instrumentation 112. The software of the emulation system 102, such as a trace subsystem, translates the warning into human-readable trace information, or debugging information, which the emulation system 102 may output to the host system 104. Software of the host system 104 (e.g., emulation software 124) presents the error signal or warning message to the user-designer via the user interface 108.

In operation, the emulator instrumentation 112 models the occurrence of the unknown logic state (X) at the control inputs of a user-design TCAM in the same manner as a wrapper or the emulation system 102 would handle unknown logic states (X) occurring at the control inputs of typical forms of user-design memories modeled by the emulation system 102. The wrapper logic may handle the unknown logic state (X) on the control inputs of the user-design TCAM. For instance, according to the wrapper, the unknown values (X-bits) on control signals (including an address) raise an assertion or generate a warning signal (which may, for example, be displayed at the user interface 108). The wrapper logic may generate the runtime error signal and/or the warning message in response to the wrapper logic receiving and identifying the unknown logic state (X) occurring at the control input port of the user-design TCAM.

In some circumstances, the wrapper logic may receive the unknown logic state (X) at, for example, a port for a Write-enable (WE) control signal. In such circumstances, the emulator instrumentation 112 and the logic of the DUT 114 might be unable to determine which user-design TCAM or which address to write the user-design content data, and/or unable to determine what to user content to write. To avoid problems caused by unknown logic states (X's), the wrapper logic may prevent or otherwise causes the user-design TCAM to perform "no write" in response to the wrapper logic detecting the unknown logic state (X). Additionally or alternatively, the wrapper logic may generate the error signal and/or warning message indicating that, for example, an "unknown write occurred." Similarly, the wrapper logic of the user-design TCAM may receive and identify a control signal accessing user content having one or more unknown logic states (X's) on an address. For instance, if the wrapper logic determines that a control signal at a port for a Read-enable (RE) or Write-enable (WE) includes one or more unknown logic states (X's) on the address, then the wrapper logic causes the user-design TCAM (or other components of the user design being modeled) to perform "no write" or "no read." Additionally or alternatively, the wrapper per logic may generate an error signal and/or a warning message for the user interface 108 indicating, for example, an "unknown address."

In some implementations, the wrapper logic may identify certain conditions when one or more unknown bits (X-bits), of one or more unknown logic states (X's), occur at a pin or pint of the user-design TCAM (or the physical binary memory). In response to the wrapper logic detecting the given condition (e.g., particular set of X-bits) in the control signals and/or content data, the wrapper logic generates a one-bit signal (e.g., assertion, warning) indicating the given condition. Additionally or alternatively, the wrapper logic may causes the netlist logic of the DUT 114 and/or the binary memory hardware (or other hardware) of the emulation system 102 to generate the one-bit signal (e.g., assertion, warning) indicating the given condition. The error assertion signal or warning message indicates certain information associated with the memory hardware having the X-bits, such as the time of the X-bits, memory port of the memory having the X-bits, and the binary or ternary values modeled by the control bits (e.g., CE, WE, RE) or memory content (e.g., ADDR, data at ADDR).

In some embodiments, the emulation system 102 may generate one or more messages for the user interface 108 when the emulation system 102 attempts access a memory containing X-bits on the control bits and/or the content bits. Each memory wrapper generates a variety of outputs related to the certain conditions or corruption events, and software and hardware components of the system 100 provide some sort of message to the user interface 108. In each warning or assertion, the designer and emulation system 102 references the given waveforms at the time of the warning or assertion to identify or determine the portion of the memory and cycle time associated with the warning or assertion. Non-limiting examples of the warnings or assertions include a true assertion, a DPI message, and an instrumentation logic "sticky bit," among others. The true assertion indicates that a given event occurred for conditions consistent with the designer's expectations or the designer's test. The DPI message assertion generates a message to the designer using DPI-based messaging functions (e.g., $display). The DPI message assertion fires for a condition, for example, consistent with a given logical test or consistent with other messages generated by the DUT 114, and according to memory model options that control printing messages. The sticky bit assertion creates one or more sticky bits that, at runtime, cause the emulation system 102 to query the signals and add messages to the log files for tracing by the designer. In some cases, the designer may deposit or force the sticky bit(s) as desired to function as a mask or to reset corruption events. The emulation system 102 transmits the messages or log files to the host system 104 and/or displays the messages or log files at the user interface 108, allowing the designer the opportunity for debugging.

Figure 2A:
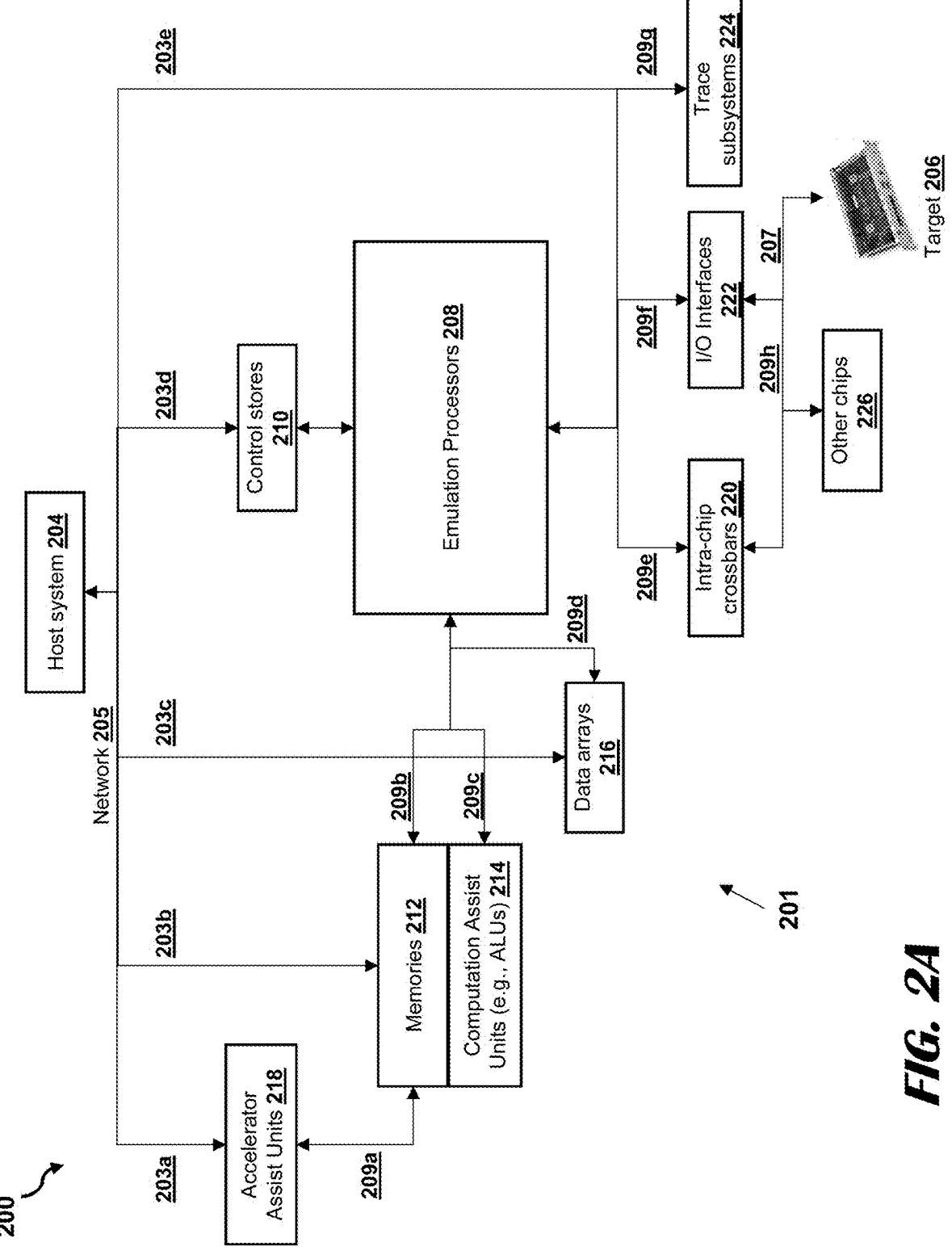
FIG. 2A shows components of a system for performing emulation processes described herein, which includes depicting components within an emulation chip (e.g., ASIC 201) of an emulation system, according to an embodiment.
Figure 2B:
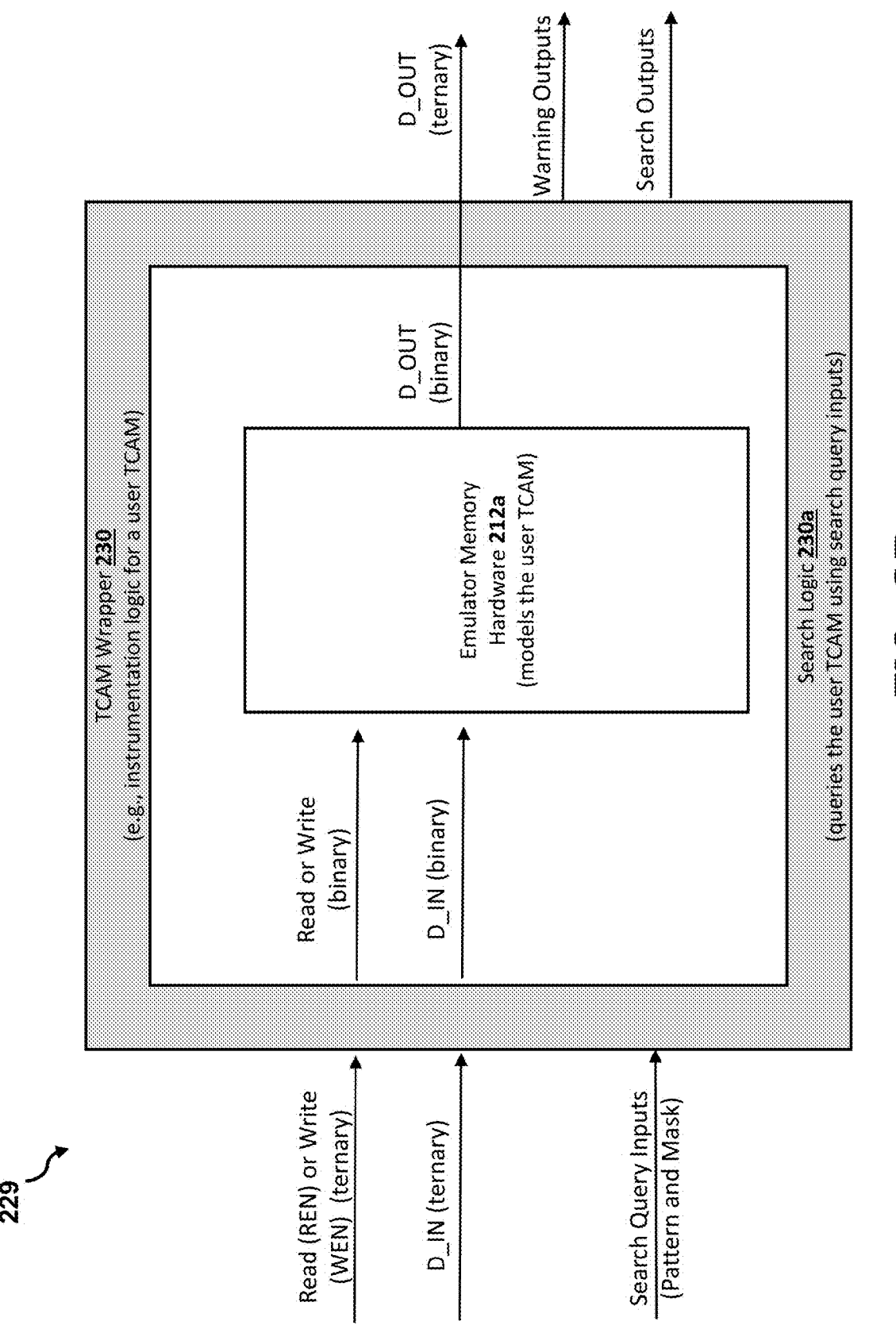
FIG. 2B depicts a logical representation of a user-design TCAM wrapper of instrumentation logic "wrapped" around certain physical hardware components of the emulation system, according to the embodiment of FIG. 2A.

FIG. 2A shows components of a system 200 for performing emulation processes described herein, which includes depicting components within an emulation chip (e.g., ASIC 201) of an emulation system (e.g., emulation system 102 of FIG. 1). FIG. 2B depicts a logical (rather than a literal or entirely physical) representation of a user-design TCAM wrapper 230 of instrumentation logic "wrapped" around certain physical hardware components of the emulation system 200. The system 200 includes a host system 204 (e.g., host system 104 in FIG. 1), the emulation system, and a target system 206. The emulation system includes any number of emulation chips or similar hardware (e.g., ASIC 201, other chips 226).

The example ASIC 201 comprises emulation processors 208, control stores 210, memories 212, computation assist units 214, memory data arrays 216, simulation acceleration assist units 218, intra-chip crossbars 220, input/output crossbars and interfaces (I/O interfaces 222), and trace subsystems 224. One or more interconnects 209a-209h (collectively or commonly referred to as interconnects 209), such as wires, connect the components of the ASIC 201. One or more communication links 205 (e.g., communication links 105 in FIG. 1) connect the host system 204 with the ASIC 201 as connections 203a-203e of the communication links 205 (collectively or commonly referred to as connections 203). One or more connections 207 (e.g., connection 107 in FIG. 1) connect the target system 206 with the hardware of the emulation system (e.g., ASIC 201, other chips 226).

The ASIC 201 includes a large number of emulation processors 208 (e.g., Boolean processors) that perform the functions of the IC design during emulation. An emulation processor 208 of the emulation processors 208 may be any computational unit configured to perform logic computation for emulating (or modeling) logic systems of a DUT. For instance, the emulation processors 208 may include reprogrammable logical hardware, such as Boolean processor-based systems, FPGAs, or the like. The control store 210 includes any number of machine-readable, non-transitory storage accessible to (or otherwise associated with) the emulation processors 208. The control store 210 includes, for example, instruction memories containing instruction sets (generated from netlist logic) for execution by components (e.g., the emulation processors, multiplexers, memories 212) of the emulator.

In operation, the emulator loads the machine-executable instructions (representing the logic of the netlist) into a storage medium of the control store 208 associated with the emulation processors 208 (or other components of the emulator). The emulation processors 208 (or other components of the emulator) may retrieve the machine-executable instruction sets from the control store 210 (or other storage location) for executing (or instrumenting) the instrumentation logic in order to model the logic components of the given DUT. The emulation processors 208 then execute the logic over one or more emulation cycles of the emulation system. The logic could be the same for different emulation cycles, and the data on which the logic operates may change because of the change in the states of the DUT from one cycle to another. The state data represent, for example, the state of the DUT's state elements, intermediate combinational nodes (e.g., multiple devices functioning as a more complicated device), and states of design memories.

The memories 212 of the emulation system comprise various types of physical binary memories capable of modeling user-design memories and memory-related functions, according to the DUT's logic, which may include the netlist logic or the instrumentation (wrapper) logic. For ease of description, the memories 212 in FIGS. 2A-2B include allocated and scheduled portions of physical binary memories 212a to model a user-design TCAM (or other types of user-design memory component) of the DUT. Conceptually, the allocated memory 212a is "wrapped" with wrapper logic of a wrapper 230 allowing the wrapped memory 212a to model the particular user-design TCAM, according to the netlist logic of the netlist, in conjunction with the wrapper logic of the wrapper 230 instantiated for the particular user-design TCAM.

The memories 212 include hardware components for storing bits of user content data or control bits, where the memories 212 include memory-based memory 212 comprising a type of machine-readable memory (e.g., RAM, INTRAM) or storage components (e.g., physical flip-flops, physical latches, physical registers, virtual instrumentation logic). The memories 212 store, for example, the logical state data, logical state elements, and/or other types of logical inputs/outputs. These logical inputs/outputs may be any signals or bits related to or generated by the DUT, the user content data, and/or the control bits. Additional or alternative storage components (e.g., data arrays 216) of the emulator may define, and used to model, the user-design TCAM. The compiler (or other component of the emulation system) may allocate these additional storage components to model the user-design TCAM. The emulation system logically and/or physically organizes the physical memories 212 of the emulation system as arrays, which the emulator allocates to the components of the DUT for modeling the user-design TCAM.

The ASIC 201 may further include one or more computation assist units 214 that the ASIC 201 uses to model certain functions, including functions not efficiently handled by general-purpose bitwise processors or generic memories. The computation assist units 214 include hardware structures that, for example, perform arithmetic operations, such as arithmetic logic units (ALUs). Additionally or alternatively, the ASIC 201 includes acceleration assistance units 218, which may include embedded microprocessors, performing local processing of simulation acceleration or analysis tasks in the ASIC 201. In some cases, the acceleration unit 218 implements the local processing in the ASIC 201 along with acceleration operations executed at the host workstation 204.

The intra-chip crossbars 220 provide an interface for the emulation processors 208 to interact with the other processors of other ASICs (e.g., other chips 226). The I/O interfaces 222 may provide an interface for the ASIC 201 to interact with, for example, the host system 204, a target system 206, or other external other chips 226. Optionally, the target systems 206 and the other chips 226 may provide an external hardware environment for the DUT being emulated by the emulation system.

The trace subsystem 224 may collect and/or store bits or signals generated in the ASIC 201 (or other aspect of the emulation system), outputted during execution of the DUT. The trace subsystem 224 may function in concert with other software components of the emulation system, such as the compiler or a debugging tool for runtime or offline code debugging, where the trace subsystem 224 collects, stores, and/or interprets, for example, the outputted bits or signals (generated by the ASIC 208) or the memory states (in the memories 212 or data arrays 216). The trace subsystems 224 support, for example, one or more general modes of operations, such as dynamic probes (allowing a set of user-specified probes of hardware components with deep traces), or full vision (allowing reconstruction of all user signals without user specification and without performance impact), among others.

Prior to loading the compiled DUT into the hardware emulation, the compiler generates various types of instrumentation logic for performing various functions, such as instrumentation logic allowing the emulation system to perform various overhead or administrative functions supporting emulation execution.

With reference to FIG. 2B, the instrumentation logic may further include wrapper logic of one or more wrappers 230 for modeling corresponding user-design TCAMs 229. The compiler identifies any number of user-design TCAMs 229 in the DUT and instantiates corresponding TCAM-modeling wrappers 230. A TCAM wrapper 230 includes the wrapper logic that, together with the netlist logic loaded into a corresponding wrapped binary memory 212*a* of the emulator hardware, models the structure and functions of the particular the particular user-design TCAM 229 (e.g., TCAM search function). The wrapper 230 includes the wrapper logic enabling the physical binary memories of the wrapped binary memory 212*a* to model the TCAM-related functions, such as memory Reads/Writes and a TCAM query function, among other memory-related functions.

For instance, the wrapper logic of the wrapper 230 effectively converts the control signals and/or user-design data content from ternary (or quaternary) to binary signals or vice-versa. The TCAM wrapper 230 transforms or translates ternary signal data to/from binary signal data, based upon parameters mapped to the wrapped emulator memory 212*a*. The parameters controlling the translation of data signals to/from the wrapped memory 212*a* include, for example, size, addresses, or port definitions (types of ports, types of port functions), among other possible types of parameters. Using the wrapper logic of the wrapper 230, the netlist logic for the user-design TCAM 229 compiled and loaded into the physical binary memory 212*a* models ternary logic states for the user-design TCAM 229 and handles ternary or binary signals for portions or arrays of the wrapped memory 212*a*. As an example, the wrapper 230 may model a Write function received at a particular input port (REN or WEN port) using input content data at a data input port (data_in port), where the wrapper 230 converts the control data and/or content data from ternary into binary and writes the inputted data into the physical binary memory 212*a*. As another example, the wrapper 230 may model a Read function received at the particular control signal input port (REN/WEN port) using input content or address data, where the wrapper 230 converts the control data and/or content data from binary into ternary when reading the content data at a data output port (data_out port) from the physical binary memory 212*a*.

In some cases, a portion of the wrapper logic of the wrapper 230 includes search logic 230*a* that enables the physical binary memory of the wrapped memory 212*a* to model the TCAM search functionality. The wrapper 230 or another storage medium of the emulation system contains query matching-logic that models a ruleset for comparing the search query inputs (e.g., pattern bits, mask bits) against content data stored in the user-design TCAM 229. The search logic 230*a* receives, as an input, a search query containing one or more pattern bits (or pattern) and one or more mask bits (or mask). The search logic 230*a* applies the matching-logic ruleset, represented as TCAM search tables (such as those shown in FIGS. 4A-4H).

The wrapper 230 includes the wrapper logic for modeling the occurrence of the unknown logic state (X) at the control inputs of the user-design TCAM 229. For instance, according to the wrapper 230, the unknown values (X-bits) on control signals (including an address) raise an assertion or generate a warning signal (which may, for example, be displayed at the user interface of the host system 204). The wrapper 230 may generate a runtime error signal and/or the warning message in response to the wrapper 230 receiving and identifying the unknown logic state (X) occurring at the control input port of the user-design TCAM 229.

In some circumstances, the wrapper logic of the wrapper 230 may receive the unknown logic state (X) at, for example, a port for a Write-enable (WE) control signal, and the wrapper 230 may be unable to determine which user-design TCAM 229 or which address to write the user-design content data, and/or unable to determine what to user content to write. To avoid problems caused by unknown logic states (X's), the wrapper 230 may prevent or otherwise causes the user-design TCAM 229 to perform "no write" in response to the wrapper 230 detecting the unknown logic state (X). Additionally or alternatively, the wrapper 230 may generate the error signal and/or warning message indicating that, for example, an "unknown write occurred." Similarly, the wrapper logic of the user-design TCAM may receive and identify a control signal accessing user content having one or more unknown logic states (X's) on an address. For instance, if the wrapper 230 determines that a control signal at a port for a Read-enable (REN) or Write-enable (WEN) includes one or more unknown logic states (X's) on the address, then the wrapper 230 causes the user-design TCAM (or other components of the user design being modeled) to perform "no write" or "no read." Additionally or alternatively, the wrapper logic may generate an error signal and/or a warning message for the host system 204 indicating, for example, an "unknown address."

In response to the wrapper logic of the wrapper 230 detecting a given condition (e.g., particular set of X-bits) of the control signals and/or content data at a port of the user-design TCAM 229, the wrapper 230 may generate one or more bits for a warning or error signal indicating the given condition. Additionally or alternatively, the wrapper logic causes the netlist logic of the wrapped memory 212*a* (or logic of another component of the emulation system) to generate the warning or error signal indicating the given condition. An error assertion signal or warning message may indicate certain information associated with the wrapped memory 212*a* having the X-bits, such as a timestamp or emulation cycle of the X-bits occurring, the memory port at which the X-bits occur, the binary or ternary values modeled by the control bits (e.g., CE, WEN, REN), and/or the user memory content (e.g., ADDR, user data at ADDR).

Example Memory Controller Using Wrapper Logic

Figure 3:
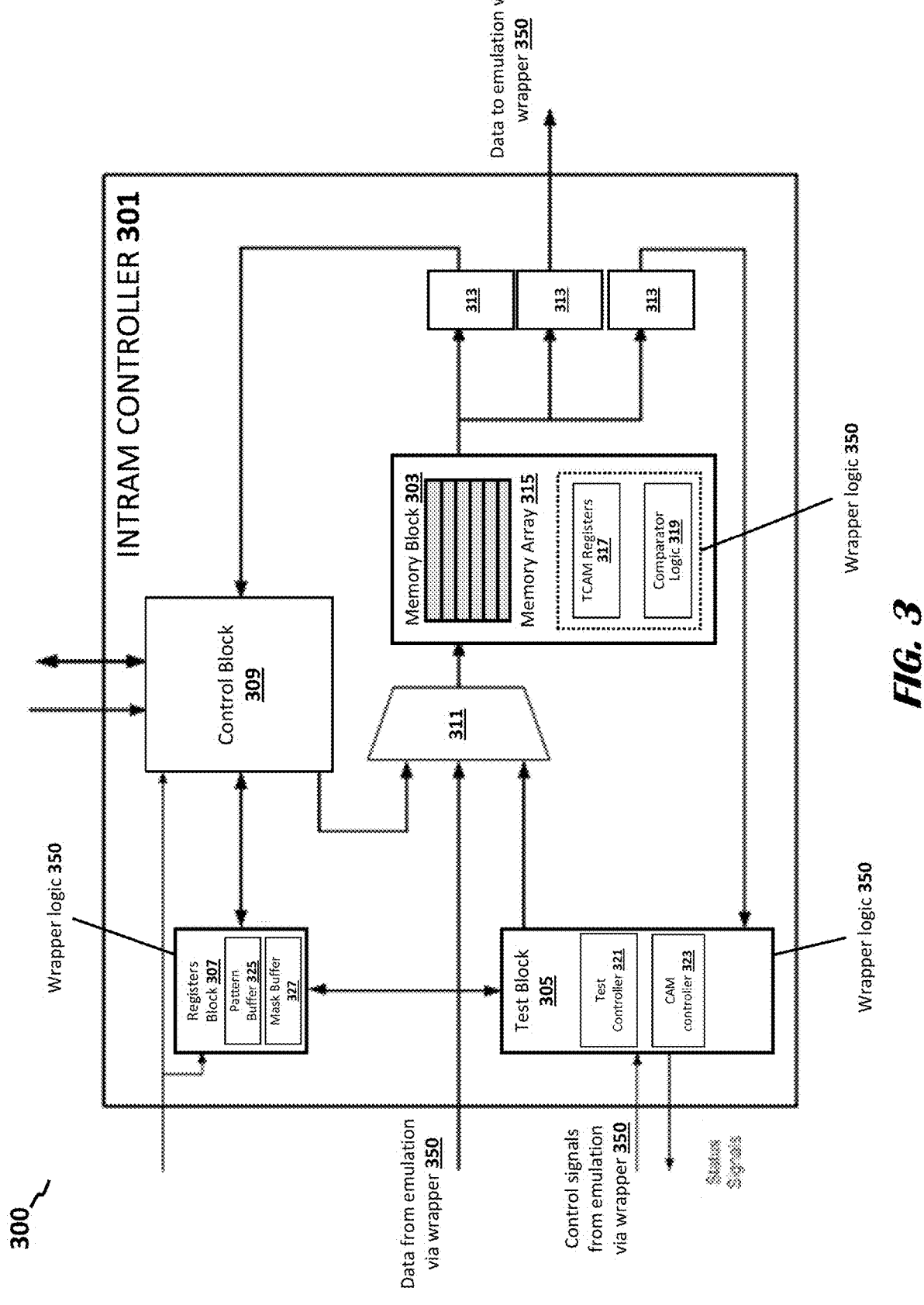
FIG. 3 shows a schematic representation of an internal memory (INTRAM) controller circuit of an emulation system employing wrappers for modeling TCAM-related structures and functions, according to an embodiment.

FIG. 3 shows a schematic representation of an internal memory (INTRAM) controller 301 circuit of an emulation system 300, which employs wrappers for modeling TCAM-related structures and functions (e.g., Read/Write function, TCAM search function) according to a netlist of a DUT. The emulation system 300 includes emulation hardware components, including INTRAM controllers 301 for physical binary memories. For each user-design TCAM of the DUT, the emulation system 300 may further implement a corresponding wrapper 350 instantiated by a compiler for the particular physical binary memory.

The INTRAM controller 301 may comprise any number of integrated circuit components, such as semi-conductor memory, one or more data signal buses, processors, transistors, and any other type of circuitry that could be a component or sub-component of an integrated circuit. The components of the INTRAM controller 301 may be physically and/or logically organized into any number of functional blocks, and may interact with wrapper logic 350. The wrapper logic 350 may logically organized into any number of functional blocks. The functional blocks may define or represent various structures or functions provided by a set of physical components (e.g., registers, processors, memory, logic gates, instruction set memory) or logical components of the wrapper logic 350. For instance, a set of underlying physical components may be organized into a memory block 303 that provides the INTRAM controller 301 with storage functionality according to data inputs translated by the wrapper logic 350. The components of the INTRAM controller 301 or wrapper logic 350 need not be organized into the same blocks as shown in FIG. 3. The structural and functional components of the INTRAM controller 301 and the wrapper 350 may have any number of number of logical or physical organizations or may have no logical organization.

The emulator hardware includes a memory block 203 comprising a memory array 215, which includes an array of one or more electronic memory circuits (e.g., SRAM, DRAM, flash memory, EEPROM) configured to store data (e.g., digital bits). The emulation system 300 further includes the wrapper logic 350 performing various transformational operations and defining various functional blocks. For instance, the wrapper logic 350 receives ternary signals generated from other circuits of the emulator and/or user design, and then translates or converts the ternary signals into binary signals. The memory block 303 receives input data, in the form of binary signals, from the other portions of the emulation via the wrapper 350.

Typically, a computer memory (e.g., RAM, SRAM, DRAM, flash) is configured to return data bits stored at a particular address, in response to a query or request that retrieves the content data stored at the given memory address. However, a user-design TCAM is configured to search the entire memory-space of the user-design TCAM in order to determine whether a set of data bits are found in one or more locations or addresses of the user-design TCAM. The wrapper logic 350 models this special TCAM search functionality using instrumentation logic that queries the user-design TCAM instance and attempts to match a set of stored data content against a set of queried or requested data. The wrapper logic 350 receives a query input that indicates the queried data, represented by a set of pattern bits. In some implementations, the TCAM memory returns one or more addresses where the pattern bits were identified. Additionally or alternatively, the TCAM memory may return the queried data and/or additional information. In some implementations, in addition to a memory hardware circuitry (e.g., INTRAM controller 301) the wrapper logic 350 being capable of executing and managing the specialized TCAM functions (e.g., TCAM search function), the memory controller circuit (e.g., INTRAM controller 301) and/or the wrapper logic 350 may further model other functions of the memory controller, such as translating ternary signals to/from binary signals and modeling Read and Write memory functions.

Ordinarily, a CAM/TCAM memory performs one of two query types: a binary CAM-type of query or a ternary TCAM-type of query. A CAM-type query typically uses the set of pattern bits to query whether a set of data bits stored in the memory matches (or does not match) the pattern bits received in the query input. A TCAM query uses mask bits in addition to the pattern bits, allowing for additional matching result-states. The query input provided to the wrapper logic 350 may include the set of one or more pattern bits and the set of one or more mask bits. The mask bits allow for the wrapper logic 350 to query using unknown values. In particular, the wrapper logic 350 queries the user-design TCAM using mask bits representing, for example, an unknown state (X), a "wildcard" or "match everything" state (?), and/or a "never match" state (-) that does not match unless the pattern is a complete match. Beneficially, the wrapper logic 350 moots distinctions between the two types of queries, because the CAM-type queries are represented in the wrapper logic 350 as having irrelevant or negligible mask bits providing no functional or logical effect on the query-matching function. As such, the CAM and TCAM search functions, and related wrappers, are described and implemented interchangeably.

Using these additional mask bits, the TCAM query performed by the wrapper logic 350 determines an output for each bit in the user-design TCAM indicating, for example, whether there is a match. The additional types of mask bits may, for example, allow the wrapper logic 350 to output matches according to wildcard matches. The wrapper logic 350 could determine that, for example, a data bit stored in the user-design TCAM matches a corresponding pattern bit (even though there is no match), and yet the wrapper logic 350 returns a match because the mask bit indicates a wildcard (?) that matches everything. For instance, the user-design TCAM may have stored data bits {10000, 10010, 10100, 10110}, and the wrapper logic 350 may receive pattern bits {10000} and mask bits {10??0}. Because of the wildcard state (?) in the mask bits, the wrapper logic 350 modeling the TCAM query will identify matches for those bits.

In the example system 300, the emulation hardware includes the INTRAM controller 301, the memory block 303 having a memory array 305, a control block 309, an input multiplexer 311, and output registers 313. The INTRAM controller 301 may include any number of signals buses that support signal transmissions among components of the emulation system 300, including the wrapper logic 350, the INTRAM controller 301, and other components of the system 300. Moreover, the wrapper logic 350 may model structures and functions for a test block 305, registers block 307, TCAM registers 317, and/or comparator logic 319. The components depicted in FIG. 3 are merely an example configuration for ease of description, though embodiments may include configurations having any number of physical and logical arrangements.

A memory array 315 may be a physical component of the emulation system 300 comprising one or more memories configured to store data bits received in data signals from other components of the emulation system 300 (e.g., emulation processors) or the INTRAM controller 301. It should be appreciated that the memory array 315 may be include memory of nearly any size, and may be organized and accessible to components of the emulation system 300 in a variety of ways. For example, in some implementations, the memory array 315 may be organized and accessed as a monolithic block of memory; and in some implementations, the memory array 315 may comprise a plurality of smaller memories organized to form the memory array 315. Additionally or alternatively, the memories of the memory array 315 may comprise a plurality of smaller memories functioning as a single monolithic memory. The memories and the memory array 315 need not be limited to embodiments in which such components are internal to the INTRAM controller 301. For instance, some or all of the memories or the memory array 315 may be located inside or outside the INTRAM controller 301, though each memory or the memory array 315 remains accessible to the wrapper logic 350 and/or hardware components for modeling TCAM search functions.

The TCAM registers 317 represent a block of virtual instrumentation logic (e.g., the wrapper logic 350) or hardware components of the emulation system 300. The TCAM registers 317 include virtual logic (or hardware register circuits or other type of circuits) capable of storing state data for modeling the TCAM search function, including pattern bits, mask bits, and other types of bits of a TCAM function received at the wrapper logic 350. A registers block 307 represents a block of virtual instrumentation logic (e.g., the wrapper logic 350) or hardware components of the emulation system 300. The registers block 307 include virtual logic (or hardware register circuits or other type of circuits) capable of receiving, storing, and forwarding the state data for modeling the TCAM search function, where the state data may include, for example, the TCAM search input (e.g., pattern bits, mask bits). In operation, the registers block 307 of the wrapper logic 350 may receive the TCAM search inputs (e.g., pattern bits, mask bits) and provides the TCAM search inputs to the memory block 303. When the wrapper logic 350 triggers the TCAM search function, the register block 307 of the wrapper logic 350 forwards the pattern bits and mask bits to the TCAM registers 317 of the wrapper logic 350. The TCAM registers 317 of the wrapper logic 350 may store, or Read, the TCAM search inputs into the TCAM registers 317. In some cases, the TCAM registers 317 may be receive pattern bits and/or mask bits directly from the test block 305. In such cases, a pattern buffer 325 and mask buffer 327 may be located within the wrapper logic 350.

The wrapper logic 350 includes comparator logic 319 comprising virtual instrumentation logic for modeling aspects of the TCAM search function. Although the components of the INTRAM controller 301 or wrapper logic 350 are initially configured to manage and store data for ordinary retrieval and storage processes, the comparator logic 219 models the querying functionality of the user-design TCAM circuit, such that the comparator logic 319 models the hardware-based search engine. In operation, the comparator logic 319 of the wrapper logic 350 may receive execution instructions and input data values from the test block 305, memory array 315, and/or TCAM registers 317. The TCAM search inputs, which may be stored in a pattern buffer 225 and mask buffer 327 of the wrapper logic 350, are read into the TCAM registers 317, and the values of the memory array 315 are read into the comparator logic 319, as indicated by the addresses listed in a special memory Read command received from the test block 305. The comparator logic 219 of the wrapper logic 350 may then output data signals containing match-result values, as determined by the comparator logic 319, according to the wrapper logic 350, data bits retrieved from the memory array 315, the pattern bits, and the mask bits. The comparator logic 319 performs comparisons between the various TCAM inputs and the stored user data in accordance with TCAM-matching logic tables (as in FIGS. 4A-4H).

A test block 305 includes virtual instrumentation logic and/or hardware emulator components that perform functions for managing and controlling various behaviors of the INTRAM controller 301 during emulation jobs. The test block 305 may comprise virtual logic of the wrapper logic 350 and/or emulator hardware circuitry, defining certain logical and/or physical sub-components, such as test controller 321 or TCAM controller 323, functioning as a state machine that may be configured to send signaled instructions to various components of the emulation system 300, such as the memory array 315, pattern buffer 325, mask buffer 327, and/or comparator logic 319. The test controller 321 and TCAM controller 323 are merely examples of potential arrangements for ease of description.

The test controller 321 controls execution of the test block 305 and the INTRAM controller 301. The test controller 321 may comprise virtual instrumentation logic (e.g., wrapper logic 350) and/or a set of one or more integrated circuit components of the emulation hardware. In some implementations, the test controller 311 may read and write values, to or from components of the INTRAM controller 301 or the wrapper logic 350. The test controller 321 may initialize values in components of the memory block 303, the wrapper logic 350, or elsewhere in the INTRAM controller 301, prior to execution of an emulation job. The test controller 321 may determine whether the memory array 315 is operating appropriately by reading and writing values into the memory block 303 and reviewing the outputs.

The TCAM controller 223 may control execution of the CAM functions of the INTRAM controller 201. The TCAM controller 223 comprises virtual instrumentation logic (e.g., wrapper logic 350) and/or a set of one or more integrated circuit components or sub-components of the emulation hardware. The TCAM controller 323 may manage read functions from the memory block 303 and determine an address of the TCAM comparison functions. As an example, the TCAM controller 223 manages which address or addresses of the memory block 303 are read and queried using the comparator logic 219 of the wrapper logic 350. In operation, the TCAM controller 323 transmits a Read command to the memory block 203, instructing the memory block 203 to read one or more addresses from the memory array 215, into the TCAM registers 217 or the comparator logic 219 of the wrapper logic 350. The data stored in these addresses is then fed to the comparator logic 219, which, in turn, compares the data bits against search query bits (e.g., pattern bits, mask bits) that are loaded, or otherwise stored, into the CAM registers 217.

The registers block 307 receives and stores data bits received from any number of components, through any number of buses and may transmit the data bits to any number of components of the 300. The registers block 307 may comprise virtual instrumentation logic (e.g., wrapper logic 350) and/or a set of one or more integrated circuit components or sub-components of the emulation hardware. In some embodiments, as in the example system 300, the registers block 307 comprises the pattern buffer 325 and the mask buffer 327. The pattern buffer 325 and the mask buffer 327 may be components of the wrapper logic 350 or other virtual instrumentation logic. The pattern buffer 325 and the mask buffer 327 store the sets of data bits (e.g., pattern bits, mask bits) received as TCAM search inputs from other components of the emulation system 300, such as the test block 205. The wrapper logic 350 or emulator hardware includes the pattern buffer 325 and the mask buffer 327, which may receive the TCAM search inputs at a port of the user-TCAM.

The pattern buffer 325 includes virtual instrumentation (e.g., wrapper logic 350) or emulation hardware (e.g., registers or other storage circuitry) for storing the set of one or more pattern bits that represent the TCAM search query parameters for the comparator logic 219. The wrapper logic 350 writes the pattern bits into the pattern buffers 225, as received from other components of the emulation system 300 by the wrapper logic 350. The mask buffers 227 includes virtual instrumentation (e.g., wrapper logic 350) or emulation hardware (e.g., registers or other storage circuitry) for storing the set of one or more mask bits that represent the TCAM search query parameters for the comparator logic 219.

In some embodiments, the INTRAM controller 201 comprises an input multiplexer 211 comprising one or more processors, or other circuitry, configured to manage the input flow of data into the memory block 203. For instance, the input multiplexer receives user data inputs from the wrapper logic 350, where the wrapper logic 350 may, for example, translate or transform an inputted ternary input signal to an inputted binary input signal. In some implementations, the input multiplexer 211 may comprise an instruction memory store that stores a series of execution instructions that control the behavior of the input multiplexer 211. The instructions in the instruction store of the input multiplexer 211 instruct the input multiplexer 211 which of the buses or inputs to select an input from for a particular emulation cycle. The input multiplexer 211 then, for example, outputs a signal to the memory block 203.

Output registers 313 may store outputs produced by the memory block 203 or the wrapper logic 350, such as the comparison logic outputs produced by the comparator logic 319, or output produced by a Read function from the memory array 315. The output registers 313 may, for example, temporarily store the data outputs for one or more emulation cycles, and then may transmit the data to the wrapper logic 350, which translates or transforms the output data from a binary signal to a ternary signal.

Example TCAM Logic Tables

FIGS. 4A-4H show logic tables 400a-400h implemented by instrumentation logic for modeling TCAM search functionality of a user design TCAM. A compiler synthesizes and compiles a user's IC design from, for example, a logical representation or description (e.g., HDL format) of the user design into a netlist representation of the DUT, containing logic for emulating the user design, which includes one or more user-design TCAM instances.

A portion the DUT's logic includes wrapper logic of a wrapper, comprising the virtual instrumentation logic for modeling the structures and functions the user-design TCAMs. For instance, the wrapper logic manages and references a matching-logic table 400a-400h when modeling the TCAM search functions. The wrapper logic may further manage the TCAM storage functions, such as functions to read or write data entries as required. In addition, the wrapper logic may model or access various ports (e.g., read port, write port) or other structural components of the user-design TCAM. In some implementation, the wrapper logic includes one or more ports of the user-design TCAM, such as a TCAM search port at which the user-design TCAM receives the TCAM search inputs as query requests, which takes a bit-pattern and/or a mask as a parameter. The wrapper logic accesses the TCAM search port, causing the wrapper logic and/or netlist logic of the user-design TCAM to compare the user data stored in addresses of the user-design TCAM against the pattern bits and mask bits. The wrapper logic may include comparator logic that performs the comparisons, and returns each row of the user-design TCAM that, for example, matches the bit pattern of the query request according to a matching logic table 400a-400h. Using the matching table 400a-400h, the comparison logic determines the outputs based upon the pattern bits, mask bits, and the data read from the physical memory instance underlying the user-design TCAM instance.

FIG. 4A shows a logic table 400a of wrapper logic for a TCAM-search performed by user-design TCAM, according to an embodiment. The table 400a shows the intended comparison result of comparing pattern bits against data bits read from certain memories (shown as "A") and the results of comparing the pattern bits against the data bits read from other memories (shown as "B"), according to the programming of the TCAM logic. For example, if the mask is zero (0), then the TCAM logic returns a match, because the TCAM logic is programmed to "not care" whether there was a match. Based on the results, described in the "Match On" row of the table 400a, the wrapper logic generates output bits comprising ones and zeros.

FIG. 4B shows a matching table 400b of wrapper logic modeling a TCAM-search function of a user-design TCAM structure, according to an embodiment. In the example embodiment, a user IC design for a networking device having TCAM design elements. Compiler software performs a synthesis and compiling function to generate a DUT representing the user design, where the DUT includes the logic for instances of the user design and instrumentation logic generated by the compiler software. The DUT includes the logic for modeling the structures and functions of the user-design TCAMs, including functions for storing data used for routing packets, such as data for a routing table or hash table. In this example, the user-design TCAM contains data modeling a list of network ports to which a data packets should be routed based on an IP address. When a packet arrives, the user-design TCAM searches for an IP address in the table, and, if present, the user-design TCAM outputs match signal for each line or address of memory indicating that the content of that line matches a pattern representing a the queried IP address. Moreover, the user-design TCAM allows the content to represent an Always Match or Never Match conditions. In operation, the DUT's logic (e.g., netlist logic and wrapper logic) manages and reference the matching table 400b, and handles Read and Write entries as needed via Read/Write ports. In addition, the wrapper logic includes and accesses a port, sometimes referred to as a "search port," of the user-design TCAM that causes a TCAM search request to return each row of the user-design TCAM that matches a requested pattern. The wrapper logic receives TCAM search inputs for the TCAM search, which includes the pattern and the mask as the query parameters.

For example, the wrapper models a TCAM search using a pattern=0A08080100 and a mask=FFFFFFFF00. In this example, the TCAM search is a request to find lines in the TCAM memory that match an IP=10.8.8.1. In this case, the last byte is excluded because the IP address is treated like a key of a hash, and a port is the value. The search logic may disregard the value when matching the key. In this example, the search operation will return a 4-bit match[3:0]==0100. As another example, if the TCAM wrapper search performs a query for an IP=192.168.12.1, then the search returns match[3:0]==0011. As another example, if the TCAM wrapper performs a query for an IP=192.168.55.55, then search returns match[3:0]==0011. The match values may be returned in the bit form or priority-encoded into an address.

As shown in the table 400b, the content data and the pattern effectively are ternary values, rather than simply binary. Notably, however, this should not be confused with the use of "ternary" in four-state logic emulation, referring to three potential logic states {0,1,X}. The last byte of the "Content (Value)" column indicates a port to which the packet should be directed (e.g., Port 0, Port 1, Port 2, Port 4, shown in the rightmost column of the table 400b) when instrumenting a user's DUT for a CAM/TCAM in the user's packet-routing circuit. For ease of discussion and understanding, FIG. 4B depicts "simplified" encoding and representative data. However, the encoding used by the user-design TCAM in an emulation system may be more sophisticated or convey more information.

The encoding used by the user-design TCAM in an emulation system may include, for example, two bits for each "signal bit-position," known as X and Y, which may be interpreted according to the TCAM content encoding table 400c shown in FIG. 4C. The bit-position (n) of the pattern or the content includes an X value (X[n]) and a Y value (Y[n]), which the wrapper logic reads and interprets together, as two bits. In some cases, the interpretation of the bits may be represented as a shorthand value {1, 0,?,-}. As an example, the wrapper logic interprets pattern bits (00) as matching everything (?). As another example, the wrapper logic interprets pattern bits (11) as never matching anything (-).

As an example, with reference back to the table 400b of FIG. 4B, the last byte of the "Content (Value)" column indicates a port to which the packet should be directed (e.g., Port 0, Port 1, Port 2, Port 4, shown in the rightmost column of the table 400b). As mentioned, in some cases, the mask or query permits an "always match" or "never match," such that the TCAM logic need not search and compare every bit or byte in the memory's content. In this example, the third column, entitled the "Content (should match)" column, contains masks for determining a port for routing the data packets, where the least significant bits (or bytes) in each row include some number of "00" bits or byte, representing "always match" on those bits or bytes. The TCAM logic does not search the fifth byte for any row, because each row includes "00" values in the fifth byte. In some implementations, the TCAM logic uses the "Content (value)" column to store both the key and the value. For instance, the first four bytes may represent or contain the key and the fifth byte may represent or contain the value, which in this example indicates the port number. In operation, the TCAM logic may look up C0_A8_0C_01 (192.168.12.1) to determine a port for directing a packet. The TCAM logic does not know which port to use, so the instrumentation logic presents C0_A8_0C_01_XX to the TCAM logic, which returns an indication that Address_0 matches, according to the logic table 400b. The TCAM logic (or other instrumentation logic of the DUT) performs a Read of the content, and the rightmost column of the table 400b indicates that the TCAM logic (or other logic of the DUT) should transmit that packet to Port 0. As another example, if the TCAM logic were to look up C0_A8_0A_0A (192.168.10.11), then the logic would fail to match on the first row for Address_0, but would return a match on the second row for Address_1, and direct the packet to Port 1. This indicates that, for the second row of the table 400b, if the TCAM logic determines that the IP address of the packet matches 192.168.XXX.XXX, then the logic transmits the packet to Port 1. As another example, if the TCAM logic were to look up AC_00_00_00_04 (172.1.2.3), then the logic would fail to match on the first three rows for Address_0, Address_1, and Address_2, but would return a match on the third row for Address_3, and direct the packet to Port 4.

FIG. 4D shows a TCAM search pattern-encoding table 400d. When the wrapper logic receives a TCAM search that requests the pattern bits and the mask bits together, as two bits in bit-position (n), the wrapper logic interprets the bits according to the interpretation indicated by the table 400d. In some embodiments, as in FIG. 4D, the encoding table 400d omits the interpretation for "Never Match." In such embodiments, the wrapper logic and the table 400d have no need to encode "Never Match" for a given search pattern, because the desired TCAM search will always fail.

FIG. 4E shows a TCAM matching function table 400e depicting an example of a comparison operation of the TCAM search modeled by the wrapper logic (or other instrumentation logic). Taken together, the TCAM search operation applies the function, according to table 400e, to each bit-position (n) for an effective pattern and the content. The TCAM search, as performed by the wrapper logic, produces a bit (m[n]) for each bit-position of the pattern or the content. Then if all the m[ ] bits are 1, the match[ ] bit for this address should be high In some embodiments, emulation hardware of emulation system includes INTRAM having any number of physical memory instances. Beneficially, due to the volume of physical memory instances or addresses, the wrapper logic (or other aspect of the emulation system) may perform any number of search-related comparisons in parallel-comparatively more search-related comparisons than conventional approaches in which the emulator schedules each Read individually, and automatically iterates through addresses serially. For instance, the wrapper logic and user-design TCAM may produce, for example, a 64-bit vector of match[ ] bits, every four steps, for each INTRAM, all for a single TCAM search request.

As mentioned, for a user-design CAM instance, the content and input signal are binary. As such, the user-design CAM instance may only encode {0,1} and not {0,1,?,-}— thus, only half as much physical memory is required for the same nominal CAM dimensions compared to the user-design TCAM instance. In some implementations, the compiler (or other software component of the emulation system) identifies the user-design CAM instance and instantiates the corresponding wrapper logic for the user-design CAM. The wrapper logic for the user-design CAM includes the virtual instrumentation logic for the CAM-type search function for the wrapped physical memory instance, though the user-design CAM need not include virtual instrumentation logic for a transformation or translation function that converts binary data to/from ternary data for the wrapped physical memory.

FIG. 4F shows a logic table 400f of a four-state TCAM search pattern function modeled by wrapper logic, according to an embodiment. The wrapper logic handles resolution of unknown values (X's) on the inputs of the TCAM to the desired behavior and some generation of runtime error signals, according to the wrapper logic. As in the table 400f, the 'X' represents an unknown value for the purpose of verification modeling, whereas '?' and '-' represent "real states" of the "real circuit" according to the two-bit values. The user-design TCAM may receive unknown values (X's) on the control inputs for the TCAM instance or unknown values (X's) on the user content. The logic table 400f indicates how the wrapper logic resolves unknown values on the control inputs or content data.

As an example, an unknown value (X) on a bit input (X[n], Y[n]) may occur when writing to the user-design TCAM content. Typically, the wrapper logic (or other logic of the emulator) could not know or resolve the corresponding content as zero (0), one (1), Always Match (?), or Never Match (-) or an output value. Since the logic cannot know or resolve a content value or output value, a comparison using a particular bit-input (X[n]) would fail, unless the pattern is Always Match (?). This result is represented in the furthest right-hand column of the table 400f, in which the output values of comparing the unknown value against the pattern bit would produce zeros (0), unless the bits of the query pattern includes an Always Match (?).

FIG. 4G shows a four-state TCAM matching function table 400g for referenced by the wrapper logic when matching a search pattern, according to an embodiment. In some cases, the emulation system and wrapper logic use the same content encoding for representing an unknown value (X) as for a Never Match (-). As such, the rightmost column of the table 400g may be logically condensed to include the encoding for representing the unknown value (X) and Never Match (-), which the wrapper references during comparison operations.

FIG. 4H shows a programmable TCAM function table 400h for the wrapper logic, according to an embodiment. In some embodiments, the emulation system implements emulator hardware (e.g., hardware memory) or instrumentation logic (e.g., wrapper logic) that uses the programmable function table 400*h*. In this way, the wrapper logic for the TCAM search may interpret the pattern and mask bits in any programmable manner within the user-design TCAM and physical emulator memory.

FIG. 5 shows operations of a method 500 for an emulation system having components to emulate and model an IC design that operates with unknown logic states and ternary memory functionality.

In operation 502, a compiler obtains and compiles the IC design into one or more design files (e.g., netlist) written in a machine-readable hardware format. The design data includes, for example, HDL (e.g., Verilog) and the compiler then compiles and synthesizes into the netlist.

In operation 504, the compiler identifies netlist logic in the netlist for modeling one or more user-design TCAMs of the circuit design. The compiler identifies or detects instances of user-design TCAM structures and functions in the netlist. During a compiling or synthesis operation, the complier identifies attributes indicating an instance of a user-design TCAM in the netlist. The compiler may further identify attributes indicating various structures and operations for modeling the user-design TCAM, such as instances of unknown logic states on control inputs or content data, among others. The netlist further includes various the netlist logic for modeling user-design circuit devices, which the compiler may identify and compile along with the other components of the user design (e.g., user-design TCAMs).

In operation 506, the compiler instantiates or otherwise generates wrappers for each user-design TCAM identified in the netlist. Each wrapper includes virtual instrumentation logic configuring the emulator to model the structures and operations of the particular user-design TCAM, sometimes referred to as a wrapper logic search function of the user-design TCAM.

In operation 508, the compiler merges the wrapper for the user-design TCAM into the netlist. When merging the wrapper into the netlist, the compiler may insert, add, replace, or append the wrapper logic for the user-design TCAM around the corresponding netlist logic for the user-design TCAM.

In operation 510, the compiler (or other software and/or hardware component of the emulation system) loads the DUT logic (e.g., netlist logic, instrumentation logic) into components of the emulation system; and run the emulation. At runtime, the emulator may invoke and execute the TCAM search function, in which the TCAM logic and wrapper logic perform a search query using an input search or query bit pattern for certain content data in the user-design memory of the TCAM. The TCAM logic and/or the wrapper logic performs the search for the given search query in each memory address of the TCAM memory, and returns bits indicating the location of the content sought in the query. The wrapper logic may perform one or more translation operations on the input data (fed into the TCAM memory) and on the output data (generated and outputted from the TCAM memory).

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, attributes, or memory contents. Information, arguments, attributes, data, etc. may be passed, forwarded, or transmitted via any suitable means including memory sharing, message passing, token passing, network transmission, etc.

The actual software code or specialized control hardware used to implement these systems and methods is not limiting of the invention. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and Blu-Ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A system for emulating circuit designs including ternary content-addressable memories (TCAMs), the system comprising:
   a set of emulator hardware for emulating a circuit design that is configured to operate with an unknown logic state, including a plurality of emulation processors for modeling a plurality of user-design circuits according to a netlist of the circuit design, and a plurality of physical binary memories for modeling one or more user-design TCAMs according to the netlist; and
   a computing processor configured to:
      identify, in the netlist for the circuit design, netlist logic for modeling a user-design TCAM using a physical binary memory of the emulator hardware;
      instantiate a wrapper for the user-design TCAM, the wrapper comprising wrapper logic for modeling a search function of the user-design TCAM; and
      merge the wrapper into the netlist by including the wrapper logic for the user-design TCAM around the netlist logic for the user-design TCAM of the netlist.

2. The system according to claim 1, wherein the wrapper logic is configured to model the search function using a mask and a query pattern.

3. The system according to claim 1, wherein the wrapper logic models the search function according to a matching-logic table.

4. The system according to claim 1, wherein the wrapper logic is configured to, for each TCAM address of a plurality TCAM addresses, output one or more bits indicating a comparison-result between a query pattern and content data stored in the TCAM address.

5. The system according to claim 4, wherein the wrapper logic is configured to output the comparison-result indicating no-match when the content data includes the unknown logic state.

6. The system according to claim 4, wherein the wrapper logic is configured to output the comparison-result indicating a match when the content data includes a wildcard logic state.

7. The system according to claim 4, wherein the wrapper logic is configured to output the comparison-result indicating no-match when the query pattern includes the unknown logic state.

8. The system according to claim 1, wherein the wrapper logic is further configured to model the user-design TCAM by performing one or more transformations of input ternary logic signals at one or more input ports of the user-design TCAM.

9. The system according to claim 1, wherein the wrapper logic is further configured to model the user-design TCAM by performing one or more transformations of one or more output logic signals at one or more output ports of the user-design TCAM.

10. The system according to claim 1, wherein the wrapper logic is further configured to output an error message in response to an unknown value at a port of the user-design TCAM.

11. A computer-implemented method for emulating circuit designs including ternary content-addressable memories (TCAMs), the method comprising:
   obtaining, by a computer, a netlist for a circuit design that operates with an unknown state and having one or more user-design ternary content-addressable memories (TCAMs) to be modeled according to the netlist using a plurality of physical binary memories of emulator hardware;
   identifying, by the computer, netlist logic of the netlist for modeling a user-design TCAM of the one or more user-design TCAMs;
   instantiating, by the computer, a wrapper for the user-design TCAM, the wrapper including wrapper logic for modeling a search function of the user-design TCAM; and
   merging, by the computer, the wrapper into the netlist, by including the wrapper logic for the user-design TCAM around the netlist logic for the user-design TCAM.

12. The method according to claim 11, wherein the wrapper logic models the search function of a plurality of TCAM addresses of the user-design TCAM using a mask and a query pattern.

13. The method according to claim 11, wherein the wrapper logic models the search function according to a matching-logic table.

14. The method according to claim 11, wherein the wrapper logic, for each TCAM address of a plurality TCAM addresses, outputs one or more bits indicating a comparison-result between a query pattern and content data stored in the TCAM address.

15. The method according to claim 14, wherein the wrapper logic outputs the comparison-result indicating no-match when the content data includes the unknown logic state.

16. The method according to claim 14, wherein the wrapper logic outputs the comparison-result indicating a match when the content data includes a wildcard logic state.

17. The method according to claim 14, wherein the wrapper logic outputs the comparison-result indicating no-match when the query pattern includes the unknown logic state.

18. The method according to claim 11, wherein the wrapper logic models the user-design TCAM by performing one or more transformations of input ternary logic signals at one or more input ports of the user-design TCAM.

19. The method according to claim 11, wherein the wrapper logic models the user-design TCAM by performing one or more transformations of one or more output logic signals at one or more output ports of the user-design TCAM.

20. The method according to claim 11, wherein the wrapper logic outputs an error message in response to an unknown value at a port of the user-design TCAM.

* * * * *